United States Patent
Hinshaw et al.

(10) Patent No.: US 6,313,993 B1
(45) Date of Patent: *Nov. 6, 2001

(54) STRAP SPRING FOR ATTACHING HEAT SINKS TO CIRCUIT BOARDS

(75) Inventors: Howard G. Hinshaw, Dallas; Matthew C. Smithers, Lewisville, both of TX (US)

(73) Assignee: Thermalloy, Inc., Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/099,486

(22) Filed: Jun. 17, 1998

Related U.S. Application Data

(63) Continuation of application No. 08/677,596, filed on Jul. 9, 1996, now Pat. No. 5,847,928.

(51) Int. Cl.$^7$ ..................................................... H05K 7/20
(52) U.S. Cl. ............................................................ 361/704
(58) Field of Search ........................... 174/16.3; 165/80.3, 165/185; 267/150, 160; 248/505, 510, 316.7; 211/26, 41.17; 24/295, 457, 458, 473, 625; 257/706, 707, 718, 719, 726, 724; 361/704, 707, 709–712, 717–719, 722

(56) References Cited

U.S. PATENT DOCUMENTS

| | | | | |
|---|---|---|---|---|
| 4,575,038 | * | 3/1986 | Moore | 248/505 |
| 4,884,331 | * | 12/1989 | Hinshaw | 29/558 |
| 5,170,325 | * | 12/1992 | Bentz | 361/688 |
| 5,331,507 | * | 7/1994 | Kyung | 361/720 |
| 5,384,940 | * | 1/1995 | Soule | 24/453 |
| 5,570,271 | * | 10/1996 | Lavochkin | 361/704 |
| 5,581,442 | * | 12/1996 | Morosas | 361/704 |
| 5,594,624 | * | 1/1997 | Clemens | 361/704 |
| 5,602,719 | * | 2/1997 | Kinion | 361/704 |
| 5,617,292 | * | 4/1997 | Steiner | 361/704 |
| 5,640,305 | * | 6/1997 | Smithers | 361/719 |
| 5,668,348 | * | 9/1997 | Lin | 174/16.3 |
| 5,847,928 | * | 12/1998 | Hinshaw | 361/704 |
| 5,870,286 | * | 2/1999 | Butterbaugh | 361/704 |

OTHER PUBLICATIONS

New Product Bull. "Heat Sink for Intel 80486 and 80860," 2 pages 1989 Thermalloy Inc.*

Thermalloy Heat Sinks pp. 1–6 Jun. 1991 Thermalloy Inc.*

"TCM—Thermalloy Cooling Modules . . . " 2 pages Nov. 1991 Thermalloy Inc.*

Low Insertion Force (LIF) Socket . . . pp 1,2 1992 AMP Inc.*

* cited by examiner

*Primary Examiner*—Gerald Tolin
(74) *Attorney, Agent, or Firm*—Cohen, Pontani, Lieberman & Pavane

(57) ABSTRACT

A strap spring for insertion into a circuit board for securing a heat sink to an electronic device is disclosed that has a body portion having two ends and a contact section and one or more engaging sections extending from said ends. The ends are inserted into an aperture in the circuit board and an aperture in the heat sink to anchor the circuit board to the heat sink. Electronic assemblies comprising a circuit board having a microprocessor and a heat sink having a surface larger than the microprocessor are also disclosed in which a strap spring is disposed on a side of the circuit board opposite the heat sink, and the strap extends through the circuit board to engage the heat sink.

18 Claims, 5 Drawing Sheets

STRAP SPRING FOR ATTACHING HEAT SINKS TO CIRCUIT BOARDS

CROSS-REFERENCE TO RELATED APPLICATION

This application is a continuation of U.S. patent application Ser. No. 08/677,596, filed Jul. 9, 1996, now U.S. Pat. No. 5,847,928.

FIELD OF THE INVENTION

The present invention relates to securing electronic components together. More particularly, it relates to a strap spring for attaching a heat sink to an electronic device on a printed circuit board.

BACKGROUND OF THE INVENTION

A heat sink placed in contact with an electronic device transfers heat through conduction from the semi-conductor device contained in the electronic package. U.S. Pat. No. 4,884,331—Hinshaw shows a commonly used pin fin heat sink used to dissipate the conducted heat.

Springs or clips, such as those shown in U.S. Pat. No. 4,745,456—Clemens, or U.S. Pat. No. 4,660,123—Hermann, have been used to secure heat sinks to electronic devices, and a catalog entitled "Thermalloy Semiconductor Accessories," pp. 15–29, Thermalloy, Inc., Dallas, Tex. (USA) also shows clips for attaching heat sinks to electronic devices. Page 17 of the Thermalloy catalog shows two types of wire springs for securing a heat sink to a pin grid array (PGA). Co-pending application Ser. No. 349,672, filed Dec. 5, 1994, "Strap For Heat Sink Clip Assembly," shows and describes several different clips for securing a heat sink to an electronic device. Another type of anchor for securing a heat sink to a printed circuit board is shown in co-pending application Ser. No. 08/477,794 filed Jun. 7, 1995. Both of these co-pending applications are incorporated herein by reference as if set forth in their entirety.

However, if a heat sink is larger than the microprocessor there is no secure way to attach the heat sink to the microprocessor. The microprocessor is typically, but not necessarily, a socket. Surface mount applications for Ball Grid Array (BGA), Column Grid Array (CGA), Land Grid Array (LGA), Plastic Quad Flat Pack (PQFP), are all examples of devices that are not in sockets.

In the above-mentioned prior art attachment means, which clip the heat sink to the circuit board, the circuit boards often warp due to the spring loading by the attachment device. Therefore, devices that provide attachment to the board normally have to be kept close to the microprocessor, so that the board is not put under large bending stresses. Also, some prior art clips require a soldering operation to affix the hook in the board. This usually would be a wave soldering operation, which is not normally done when surface mount technology is used.

It is therefore an object of the present invention to provide an anchor which can be inserted through a printed circuit board to secure a heat sink and an electronic device to the board.

SUMMARY OF THE INVENTION

The foregoing and other objects, features and advantages of the invention will be better understood from the following more detailed description and appended claims. It has now been found that the deficiencies of the prior art can be overcome by a strap spring in which the spring contacts the circuit board directly below the microprocessor. All of the spring loading is in compression through the circuit board is concentrated at the microprocessor. The ends of the clip snap through holes or slots in the heat sink to attach the entire assembly together. Therefore, the board is allowed to "float" and no bending moment is applied. The strap spring of the present invention can be constructed in embodiments that are easily removable by dislocating the inside corners of the attaching portions and popping them back through the holes. Embodiments of the present invention are also disclosed that have barbs or other means to snap through the board on two sides of the clip thereby locking the clip into the heat sink. Since the strap spring of the present invention easily snaps the assembly together, it can be easily automated for high production.

DETAILED DESCRIPTION OF THE PREFERRED EMBODIMENTS

Figure 1:
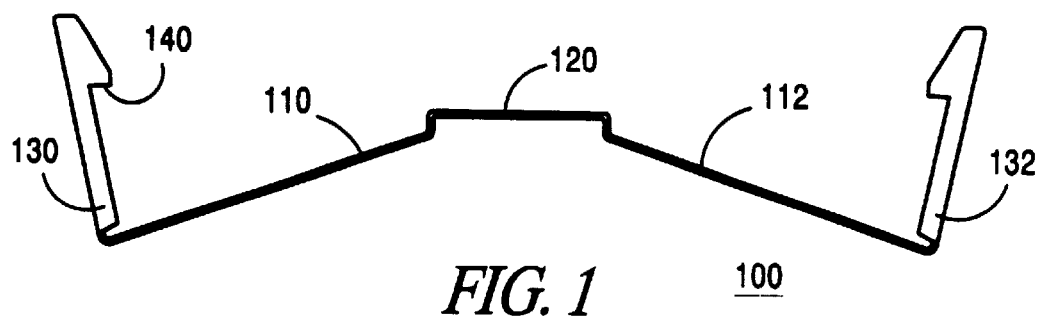
FIG. 1 is an elevation view of the strap spring of the present invention.

Referring now to FIG. 1, a side elevation view of a strap spring 100 made in accordance with the present invention is illustrated. The strap spring 100 is generally comprised of two arms 110, 112 that extend from a central section 120. The arms 110,112 each have an end and are preferably terminated with engagement sections 130,132. As explained in further detail below, various embodiments of the engagement section can be designed to permit the strap spring 100 to either be easily remove or to bZe permanently or semi-permanently affixed in place. In the preferred embodiment shown in FIG. 1, the central section 120 is connected to the arms 110,112 at a slight bend to create the flattened "V" shape illustrated. This design provides a secure mounting due to the localized force created, as explained below.

Figure 2:
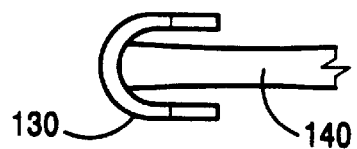
FIG. 2 is a top view, broken away, of the strap spring illustrated in FIG. 1.

FIG. 2 is a top plan view showing the detail of one of the ends 130 of the embodiment of the strap spring 100 that is illustrated in FIG. 1. Referring to both FIG. 1 and FIG. 2, it can be seen that in this embodiment, the flat strap that forms the arm 110 is bent into an arcuate shape. As will be recognized by those of skill in the art, such a shape adds rigidity and strength to the engagement portion. Although an arcuate shape is generally preferred, it will be further realized that any number of shapes, e.g., square, "V" shapes, curled edges, etc. can be used in place of the arcuate "U" shape shown in FIG. 2. As also seen in FIGS. 1 and 2, the engagement portion has a generally wedge-shaped profile with an undercut surface 140 that engages the heat sink, as explained in further detail below.

Figure 3:
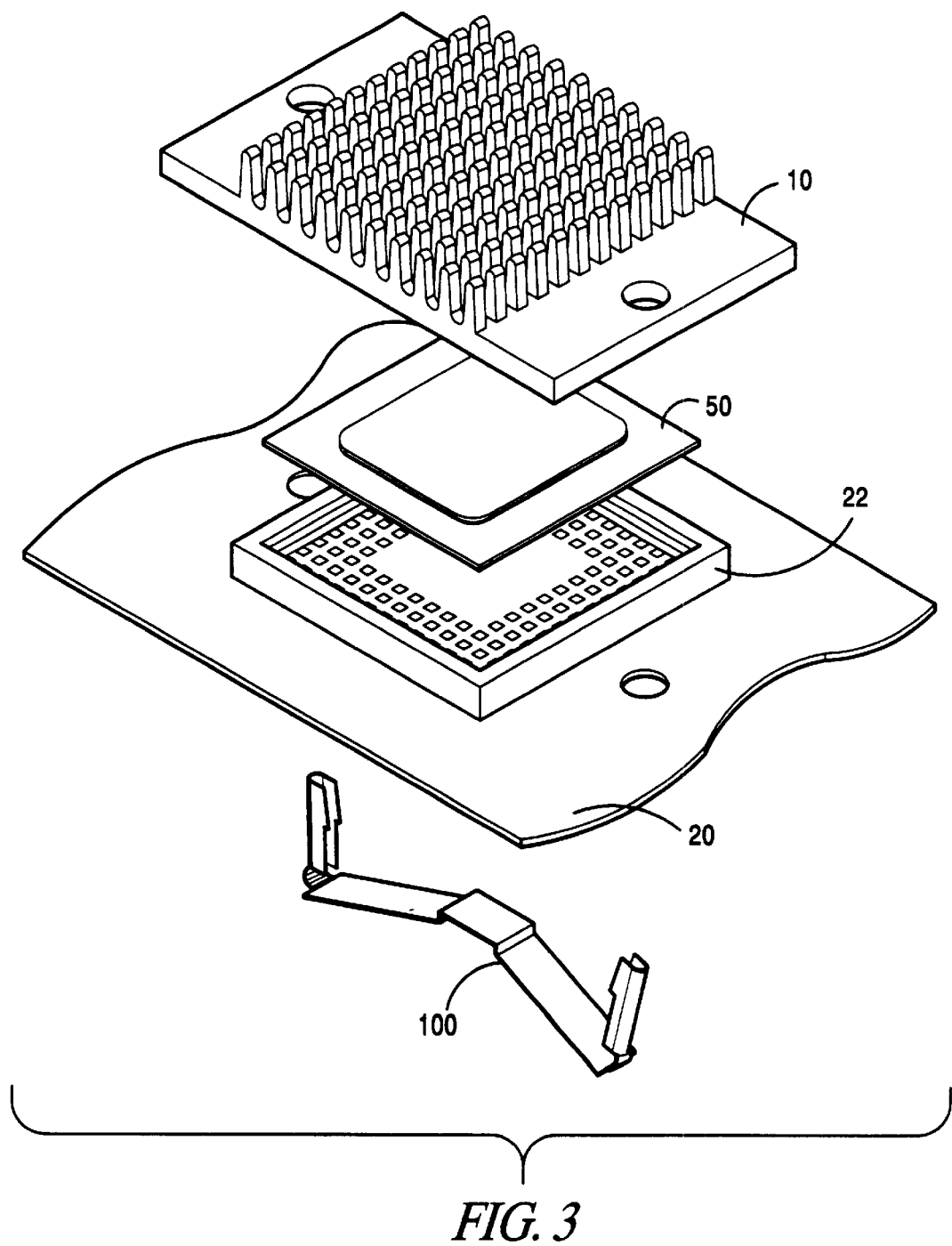
FIG. 3 is an exploded perspective view of the strap spring of the present invention and related components.
Figure 4:
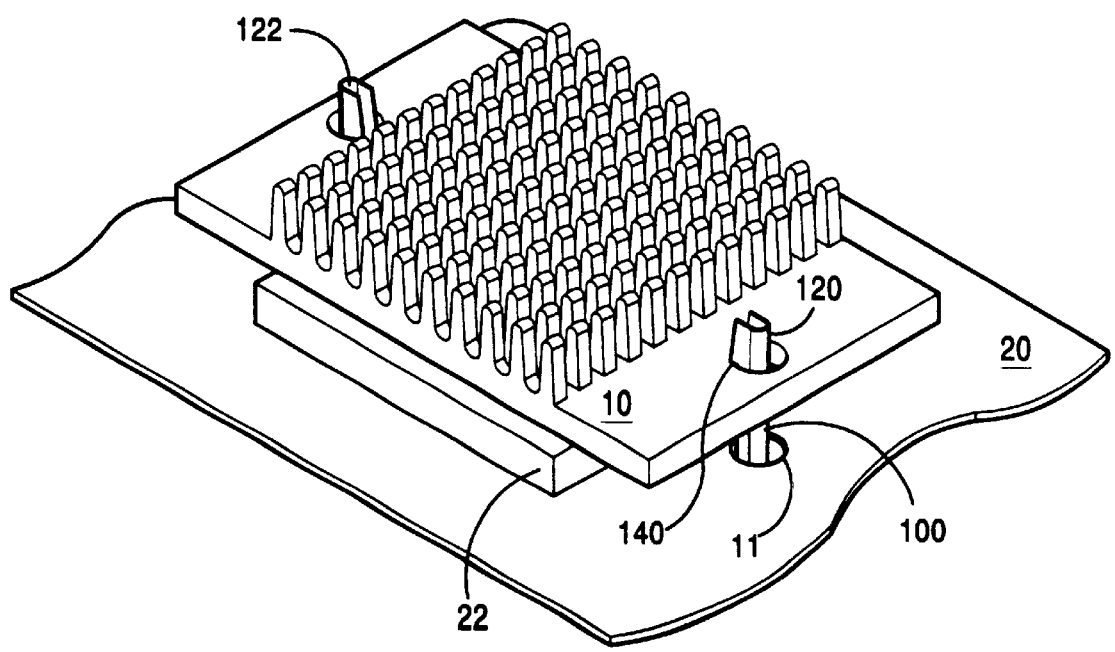
FIG. 4 is a perspective view of an assembled heat sink and electronic device anchored with a strap spring made in accordance with the present invention.

The strap spring described above is used in an assembly along with other components. Thus, referring now to FIG. 3, an exploded view of a typical assembly is illustrated. In FIG. 3, a heat sink 10, circuit board 20 and strap spring 100 are shown. The circuit board 20 is cut away to better illustrate the assembly. A socket 22 is attached to the circuit board 20, and a device 50, in the illustrated example a BCA chip, is inserted into the socket 22. Referring now to FIG. 4, an illustration of the preferred embodiment shown in FIG. 3 is provided. As shown, the strap spring 100 is preferably disposed on the side of the circuit board 20 that is opposite the heat sink 10. The engagement portions 120,122 extend through apertures in the circuit board 20, and through apertures 11 in the heat sink 10. Engagement of the undercut surface 140, combined with the force created by the flexure of the arms (not visible) combine to lock the assembly together. However, because the undercut surface 140 presents basically a sliding surface to the surface of the heat sink 10, the engagement is not permanent, and the heat sink 10 can be removed with relatively little effort by displacing the engagement sections 130,132.

Figure 5:
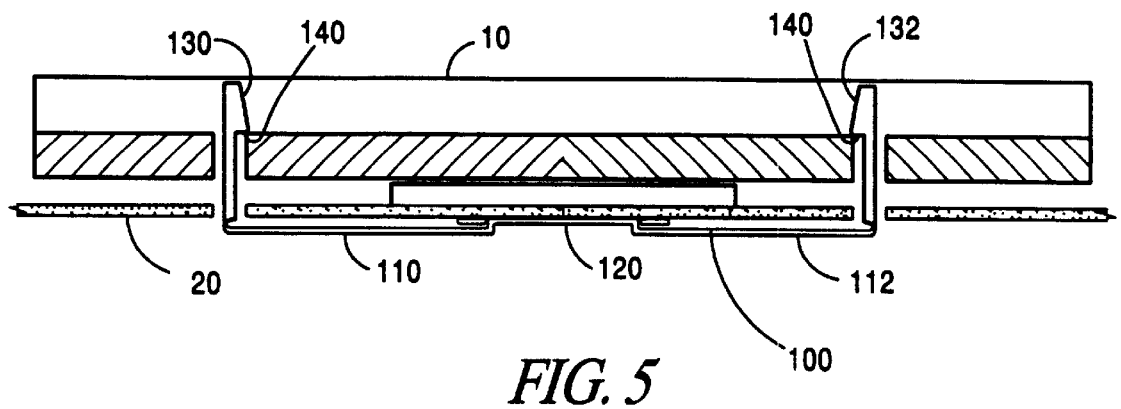
FIG. 5 is a cross-section of the assembly shown in FIG. 4, taken along line 4—4 of an assembly securing a heat sink to a printed circuit board.

Further details of the assembly illustrated in FIG. 4 are seen in the cross-sectional view of FIG. 5, which is taken along line 5—5 in FIG. 4. As seen therein, in preferred embodiments of the present invention, the microprocessor 50 is smaller than the heat sink 10, although it is possible for it to be larger in other embodiments. However, one problem solved by the present invention is its ability to provide an attachment design that can effectively retain an assembly that retains a microprocessor that is smaller than the heat sink without creating undue bending stresses and creating a stable thermal interface by mechanically forcing the microprocessor 50 into the heat sink 10. As seen in FIG. 5, the engagement portions 130,132 are "outboard" of the microprocessor 50, while the upwardly bent central section 120 ensures that any forces generated are concentrated near the microprocessor 50.

Figure 6:
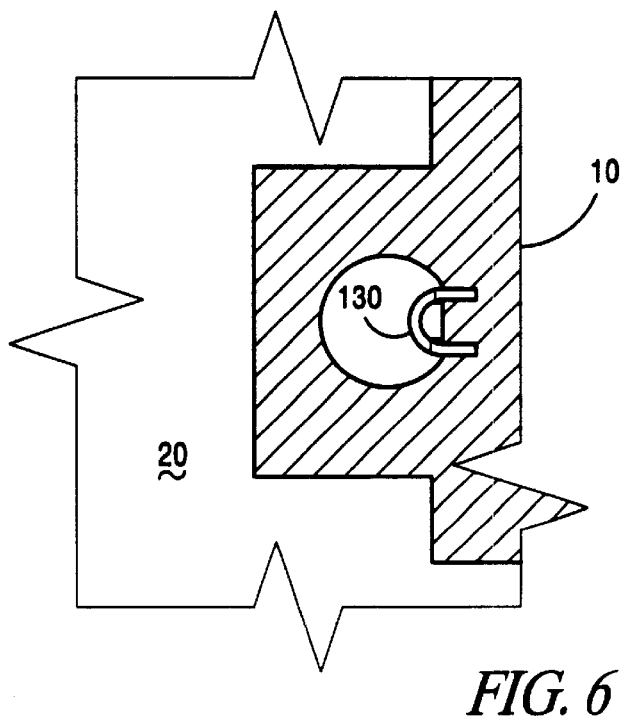
FIG. 6 is a top plan view, similar to FIG. 2, of the assembly of FIG. 5.

As mentioned above, the undercut surfaces 140 engage the circuit board 20 and resist the forces described immediately above. This engagement is further illustrated in the top plan view shown in FIG. 6. As noted above, the engagement may be one of degree, and can be easily disengaged, semi-permanent, or even permanent if desired.

Figure 7:
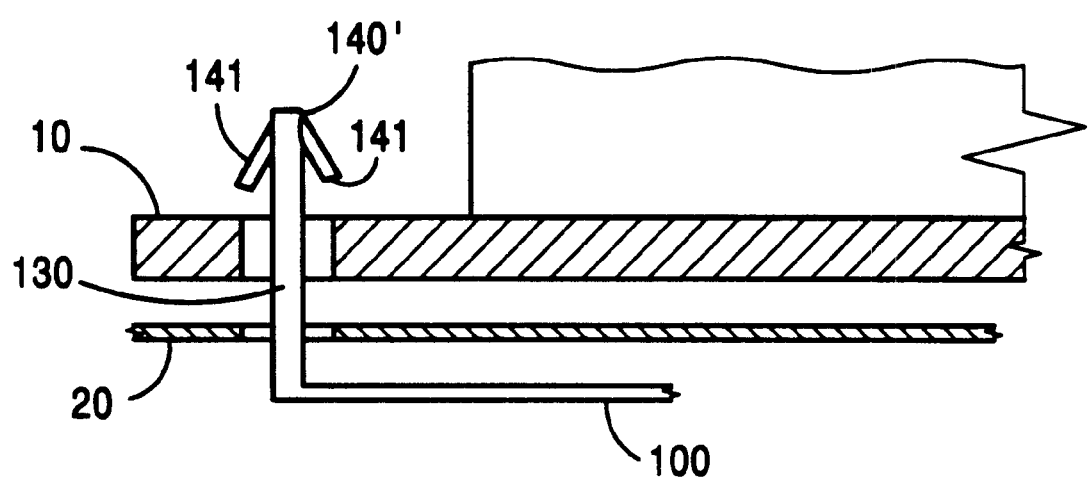
FIG. 7 is an elevation view in cross-section, similar to FIG. 5, showing an alternate embodiment of the invention.

An alternate embodiment of the strap spring 100 of the present invention is shown in FIG. 7. In those instances where it is desired to more or less permanently secure the heat sink 10 to the microprocessor, a barb 140' can be provided at the end 130 of the strap spring 100. In the illustrated embodiment, two barb points 141 are provided. It will be understood that the number, size and geometry of the barbs may be varied to provide proper securement based upon the design of the heat sink and the degree of security required.

The present invention thus also discloses improved methods of assembling electronic components in an electronic device is placed in a socket mounted to a circuit board and a heat sink is placed on the electronic device. In accordance with the invention, a strap spring is pushed though apertures in the circuit board, and then through apertures in the heat sink that are in registration with holes in the heat sink. Finally, the strap spring is engaged with the heat sink. As explained above, the engagement can be semi-permanent or permanent, and in the latter case, permanent affixation can be obtained by mechanical engagement, such as barbs.

Although the invention has been described in terms of an exemplary embodiment, the spirit and scope of the appended claims are not to be limited by any details not expressly stated in the claims. Upon review of the foregoing, numerous alternative embodiments will present themselves to those of skill in the art. It will be realized that the principles set forth above are applicable to a wide variety of situations, and are not limited to the electronic devices illustrated, the types of heat sinks illustrated. Accordingly, reference should be made to the appended claims in order to determine the full scope of the present invention.

What is claimed:

1. A combination comprising:
    an electronic assembly including a heat sink, a chip assembly, and a circuit board, said heat sink having a first and a second heat sink aperture formed therethrough, said circuit board having a circuit board contact side and a first and a second circuit board aperture formed therethrough, said heat sink comprising a substantially planar heat sink contact side and having a surface larger than at least a portion of said chip assembly, said first heat sink aperture in registration with said first circuit board aperture, said second heat sink aperture in registration with said second circuit board aperture, said chip assembly including a first contact side that contacts said heat sink contact side and a second contact side that is opposite said first contact side and that contacts said circuit board contact side; and
    a strap spring including a body portion and a first and a second spring arm, said first and said second spring arm extending from said body portion, said first spring arm defining a first end and said second spring arm defining a second end, said first spring arm end extending through said first circuit board aperture and through said first heat sink aperture, said second spring arm end extending through said second circuit board aperture and through said second heat sink aperture, said body portion urging against a side of said electronic assembly, each one of said first end and said second end urging against an opposing side of said electronic assembly to couple together said heat sink, said chip assembly, and said circuit board, whereby said circuit board is not exposed to bending moments by said spring arm ends.

2. The combination of claim 1 wherein said first heat sink aperture is co-linear with said first circuit board aperture, and said second heat sink aperture is co-linear with said second circuit board aperture.

3. The combination of claim 1 wherein said heat sink, said chip assembly, and said circuit board are in layered contact.

4. The combination of claim 1 wherein said chip assembly includes a microprocessor and a socket.

5. The combination of claim 1 wherein each one of said spring arms are flat between the body portion and the ends.

6. The combination of claim 1 wherein said first end includes a first engaging section and said second end includes a second engaging section, said strap spring holding each one of said heat sink, chip assembly, and circuit board together in compression between said body portion and said engaging sections.

7. The combination of claim 6 wherein said first engaging section includes a first mechanical coupler disposed proximate a distal tip of the first end and said second engaging section includes a second mechanical coupler disposed proximate a distal tip of said second end, said strap spring holding each one of said heat sink, said chip assembly, and said circuit board in compression between said body portion and said mechanical couplers.

8. The combination of claim 6 wherein said first and said second engaging sections each include a member for locking against said heat sink.

9. The combination of claim 8 wherein each one of said engaging sections comprises a flat undercut portion, whereby said strap spring can be disengaged from said electronic assembly.

10. The combination of claim 8 wherein said engaging sections are bent into an arcuate cross-section.

11. The combination of claim 8 wherein said member comprises a barb for permanently engaging said heat sink.

12. The combination of claim 11 wherein said barb comprises a section of said ends bent at an included angle of less than 90° to create one or more barb points to engage said heat sink.

13. The combination of claim 6 wherein said two spring arms extend substantially flat and rectilinear between said contact section and said engaging sections.

14. The combination of claim 6 wherein said engaging sections extend from said body portion to form an acute angle.

15. The combination of claim 6 wherein said chip assembly is disposed between said heat sink and said circuit board.

16. The combination of claim 1, wherein the chip assembly is mounted directly on said circuit board.

17. The combination of claim 1 wherein said body portion of said strap spring urges against said circuit board opposite said circuit board contact surface.

18. The combination of claim 1 wherein the heat sink includes fins that extend from said heat sink opposite said circuit board contact surface.

* * * * *